United States Patent
Gibbs et al.

(10) Patent No.: US 11,676,829 B2
(45) Date of Patent: Jun. 13, 2023

(54) HYPERBARIC SAW FOR SAWING PACKAGED DEVICES

(71) Applicant: Texas Instruments Incorporated, Dallas, TX (US)

(72) Inventors: Byron Harry Gibbs, Ector, TX (US); Michael Todd Wyant, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 232 days.

(21) Appl. No.: 17/139,072

(22) Filed: Dec. 31, 2020

(65) Prior Publication Data

US 2022/0208571 A1 Jun. 30, 2022

(51) Int. Cl.
| | | |
|---|---|---|
| *H01L 21/67* | (2006.01) | |
| *H01L 21/78* | (2006.01) | |
| *H01L 21/48* | (2006.01) | |
| *H01L 21/56* | (2006.01) | |
| *H01L 23/00* | (2006.01) | |

(52) U.S. Cl.
CPC .... *H01L 21/67092* (2013.01); *H01L 21/4825* (2013.01); *H01L 21/565* (2013.01); *H01L 21/78* (2013.01); *H01L 23/562* (2013.01); *H01L 2223/5446* (2013.01)

(58) Field of Classification Search
CPC .......... H01L 21/67092; H01L 21/4825; H01L 21/565; H01L 21/78; H01L 23/562; H01L 2223/5446; H01L 24/32; H01L 24/97; H01L 24/29; H01L 24/48; H01L 24/83; H01L 24/85; H01L 24/92; H01L 2224/29101; H01L 2224/2919; H01L 2224/32245; H01L 2224/45014; H01L 2224/48091; H01L 2224/48247; H01L 2224/73265; H01L 2224/83801; H01L 2224/8385; H01L 21/67201; H01L 2221/68327; H01L 2224/92247; H01L 2224/97; H01L 2924/00014; H01L 2924/181; H01L 21/6835; H01L 24/43; H01L 23/3107; H01L 23/49541; H01L 21/561; B28D 5/022

See application file for complete search history.

(56) References Cited

U.S. PATENT DOCUMENTS

| | | | |
|---|---|---|---|
| 6,841,414 B1* | 1/2005 | Hu | H01L 24/97 |
| | | | 438/106 |
| 2013/0299955 A1* | 11/2013 | Chang | H01L 21/56 |
| | | | 257/E21.499 |
| 2014/0091447 A1* | 4/2014 | Onozuka | H01L 24/24 |
| | | | 257/676 |
| 2020/0211976 A1* | 7/2020 | Kim | H01L 24/94 |
| 2021/0159189 A1* | 5/2021 | Yu | H01L 21/561 |
| 2021/0302024 A1* | 9/2021 | Chan | F24C 15/2042 |

\* cited by examiner

*Primary Examiner* — Thanh T Nguyen
(74) *Attorney, Agent, or Firm* — Dawn Jos; Frank D. Cimino

(57) ABSTRACT

In a described example, an apparatus includes: a process chamber configured for a pressure greater than one atmosphere, having a device chuck configured to support electronic devices that are mounted on package substrates and partially covered in mold compound, the electronic devices spaced from one another by saw streets; and a saw in the process chamber configured to cut through the mold compound and package substrates in the saw streets to separate the molded electronic devices one from another.

6 Claims, 12 Drawing Sheets

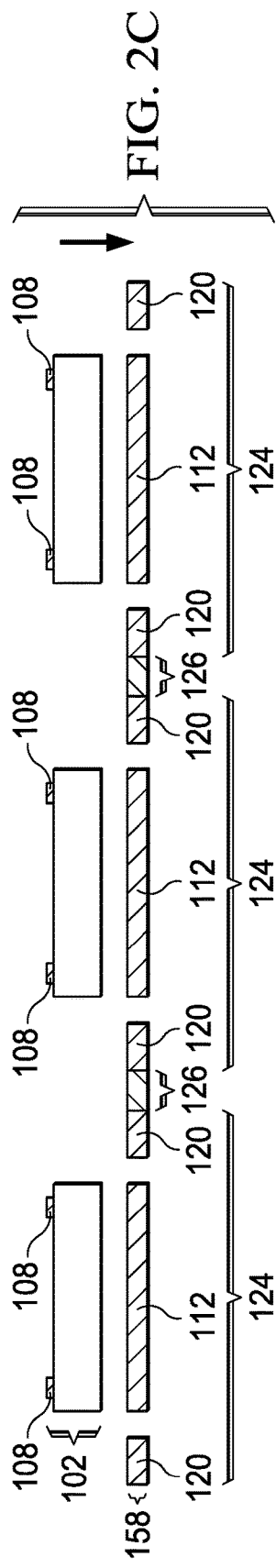
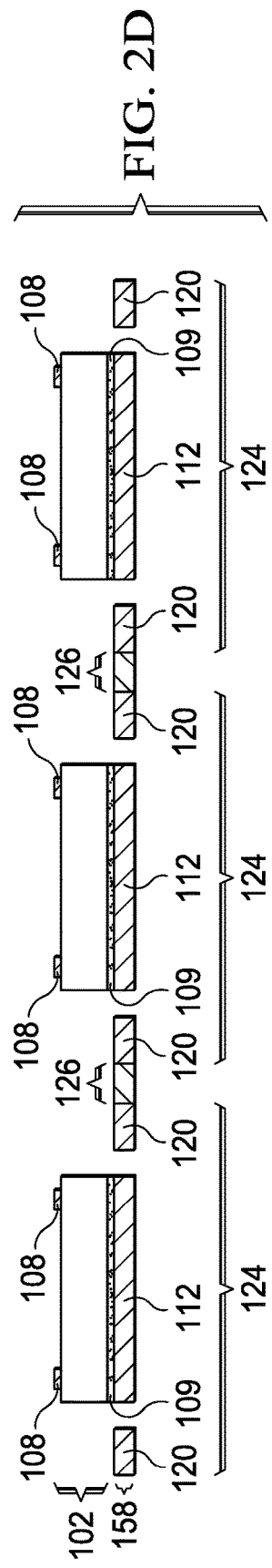
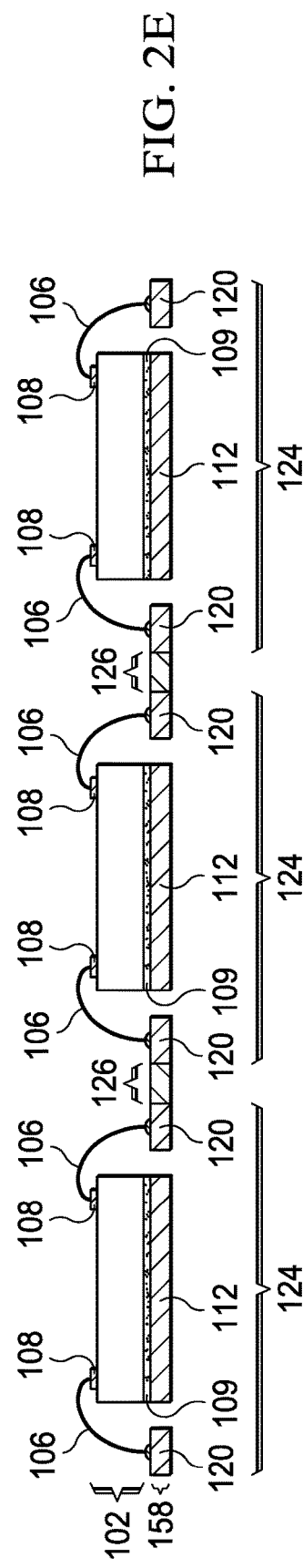

HYPERBARIC SAW FOR SAWING PACKAGED DEVICES

TECHNICAL FIELD

This relates generally to the separation of packaged electronic devices after a molding operation, and more particularly to separating packaged electronic devices with a saw.

BACKGROUND

In producing packaged electronic devices, fabrication processes include covering the devices with mold compounds to form the packages. The molding processes are done on multiple electronic devices simultaneously. The devices may be arranged in a strip of devices adjacent to one another, or in a two-dimensional array of devices in rows and columns and adjacent other devices. Once the packages are complete, the devices are separated from one another. To separate the devices from one another, a saw may be used. The saw cuts through the mold compound and package substrate materials along saw streets defined between the electronic devices, to cut through the materials and separate the devices.

As packaged electronic device sizes continue to shrink, device "fly off" events during sawing increasingly occur. In a "fly off" event, a device is forced off a support or chuck by the lateral force of the saw as it travels along the saw street, often causing the device to be damaged and scrapped. One approach to prevent fly off in sawing is to use tape sawing operations. In a tape sawing operation, a tape frame holds an adhesive tape to which molded semiconductor strip(s) of devices are mounted. The taped molded strip(s) of devices are then placed on a support in a sawing tool and sawed. The tape serves to hold the devices in position during sawing. After the devices are separated, they are removed from the tape by various methods based on tape type. Some tapes allow removal by mechanical peeling, others use ultra-violet (UV) release, hea release or chemical release. Costs for tape sawing operations and supporting tape processes are increased substantially, which is undesirable. Some tape materials are not compatible with some device testing equipment, which limits the use of those tape materials.

SUMMARY

In a described example, an apparatus includes: a process chamber configured for a pressure greater than one atmosphere, having a device chuck configured to support electronic devices that are mounted on package substrates and partially covered in mold compound, the electronic devices spaced from one another by saw streets; and a saw in the process chamber configured to cut through the mold compound and package substrates in the saw streets to separate the molded electronic devices one from another.

BRIEF DESCRIPTION OF THE DRAWINGS

FIGS. 2A-2G illustrate in projection views and cross-sectional views major steps in manufacturing a packaged electronic device.

DETAILED DESCRIPTION

Figure 1:
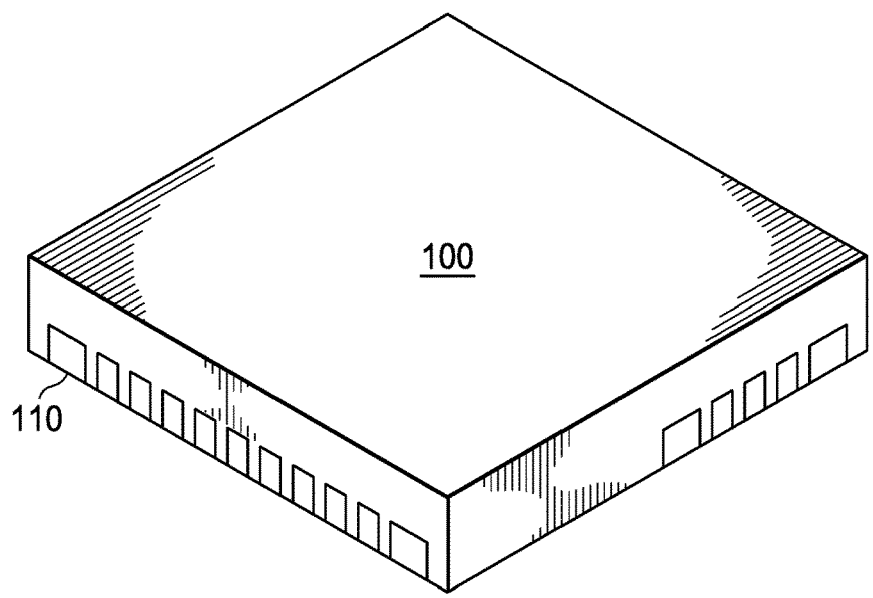
FIG. 1 is a projection view of a packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an analog-to-digital (A/D) converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD).

The term "packaged electronic device" is used herein. A packaged electronic device has at least one semiconductor device die electronically coupled to terminals and has a package body that protects and covers the semiconductor device die. In some arrangements, multiple semiconductor device dies can be packaged together. For example, a power metal oxide semiconductor (MOS) field effect transistor (FET) semiconductor device die and a logic semiconductor device die (such as a gate driver die or controller device die) can be packaged together to from a single packaged electronic device. Additional components such as passives can be included in the packaged electronic device. The semiconductor device die is mounted to a substrate that provides conductive leads, a portion of the conductive leads form the terminals for the packaged electronic device. The semiconductor device die can be mounted to the substrate with an active device surface facing away from the substrate and a backside surface facing and mounted to the substrate. Alternatively, the semiconductor device die can be mounted with the active surface facing the substrate surface and the semiconductor device die mounted to the leads of the substrate by conductive columns or solder balls. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from metals such as copper, nickel, palladium, gold, aluminum, steel and alloys such as Alloy 42 and copper alloy. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad or on leads (chip on lead) for each packaged device, and die attach or die adhesive can be used to mount the dies to the lead frame die pads or on leads (chip on lead). Wire bonds can couple bond pads on the semiconductor dies to the leads of the lead frames. After the wire bonds are in place, a portion of the substrate, the die, and at least a portion of the die pad can be covered with a protective material such as a mold compound.

The term "high pressure" is used herein. As used herein, high pressure is a pressure greater than one atmosphere. A process chamber in the arrangements can maintain a pressure greater than one atmosphere, high pressure. In the arrangements, a saw is in a process chamber that maintains a high pressure. The term "hyperbaric" means a pressure greater than one atmosphere. A process chamber that maintains a high pressure is a hyperbaric chamber.

Alternative package substrates include pre-molded lead frames (PMLF) and molded interconnect substrates (MIS) for receiving semiconductor dies. These substrates can include dielectrics such as liquid crystal polymer (LCP) or mold compound and conductive portions in the dielectrics. The lead frames can include stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as flame retardant glass reinforced epoxy resin (FR4).

In a molding process, thermoset mold compound such as epoxy resin can be used. The material can start as a solid or powder at room temperature, be heated to a liquid state, once liquefied used for molding, and then cured. Transfer molding can be used. Unit molds or block molding can be used, to form the package bodies from mold compound. The devices can be provided in an array of hundreds or even thousands of devices in rows and columns that are molded together. After the molding, the individual packaged devices separated from one another by cutting through the mold compound between them in a sawing operation. Exposed portions of the lead frame leads then form terminals for the packaged semiconductor device. Flip chip mounted devices can be used. In flip chip mounting, conductive posts or columns carrying solder at the ends, solder balls, solder columns, or solder bumps are formed on bond pads of the semiconductor die. The semiconductor die is then oriented with the solder facing a circuit board or substrate. The parts are put in contact and a solder reflow process is used to attach the solder to lands on the substrate, the solder forming a physical attachment and an electrical connection between the substrate and the semiconductor dies. Mold compound or other protective material can cover the semiconductor die, the solder joints, and a portion of the substrate to complete the flip chip package.

The term "scribe lane" is used herein. A scribe lane is a portion of semiconductor wafer between semiconductor dies. Sometimes the term "scribe street" is used. Once processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between electronic devices used to allow a saw, such as a mechanical blade, laser or other cutting tool to pass between the electronic devices cutting through material that joins them to separate the devices from one another. This process is another form of singulation. When the molded electronic devices are provided in a strip with one device adjacent another device along the strip, the saw streets are parallel to one another and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the devices from one another in the array.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements.

In the arrangements, molded electronic devices are sawed to separate packaged electronic devices from one another under hyperbaric pressure in a sawing operation. A process chamber suitable for more than one atmosphere of pressure (and thus referred to as "hyperbaric") is provided with a saw and vacuum chuck in the chamber. The vacuum chuck has first surface for supporting electronic devices and vacuum ports extending from a second surface opposite the first surface for applying vacuum to the electronic devices. Electronic devices molded together in a strip or arranged as rows and columns in an array are located in the chamber on the first surface of the vacuum chuck. Pressure greater than one atmosphere is provided. The saw is moved across saw streets cutting between molded electronic devices to separate the packaged electronic devices one from another. More than one saw blade can be used in the process that can operate simultaneously. Increased pressure in the process chamber during sawing reduces or eliminates the device fly off events that can occur in sawing without the use of the arrangements, when the lateral forces of the moving saw exceed a holding force between the devices and the vacuum chuck, thus sometimes forcing devices to fly from the device chuck. Packaged electronic device sizes are decreasing, as is the area of the packaged electronic devices. As the area of the packaged devices decreases further, the arrangements enable further increase of the holding force by applying additional pressure to the devices during sawing, preventing device fly off.

FIG. 1 illustrates a packaged electronic device 100 in a quad flat no lead (QFN) package. The packaged electronic device has a body formed from a thermoset mold compound, such as epoxy resin. Other mold compounds, such as resins, epoxies, or plastics can be used. Leads 110 are part of a package substrate that supports a semiconductor die (not visible, as it is obscured by the package) within the package, the leads 110 are exposed from the mold compound and form electrical terminals for the packaged device. The packaged electronic device can be mounted to a circuit board using surface mount technology (SMT) and solder. Package sizes are continually decreasing, and currently can be several millimeters on a side to less than one millimeter on a side, although larger and smaller sizes are also used. Future package sizes will be smaller.

Figure 2A:
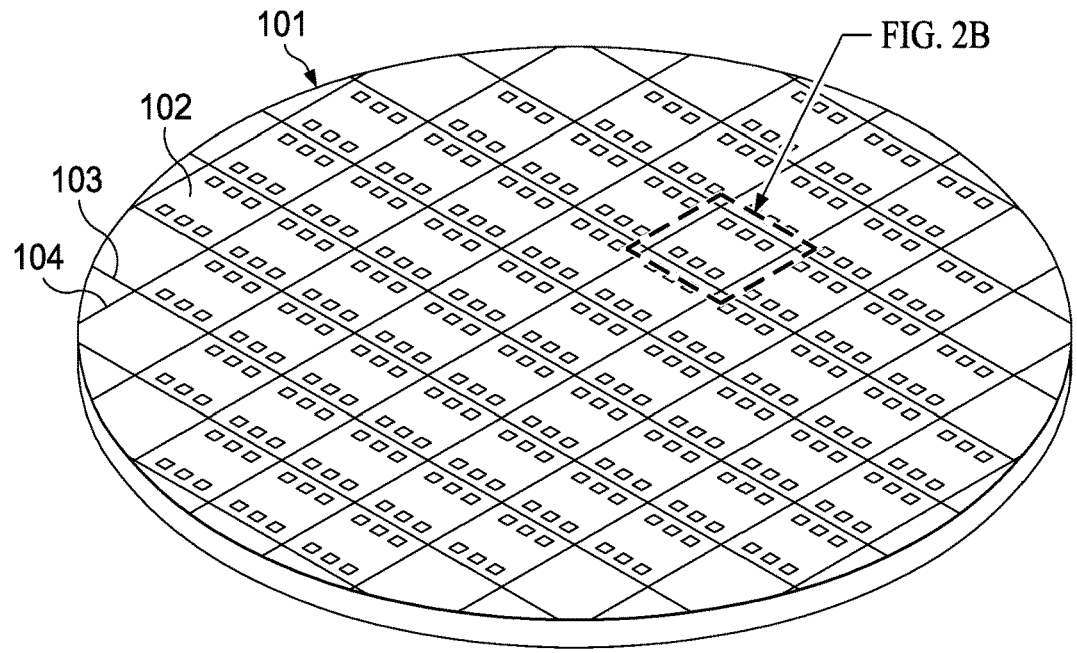
Figure 2B:
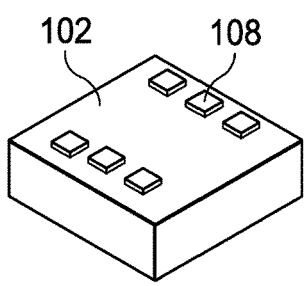

FIGS. 2A-2G illustrate in a series of steps a method for forming packaged electronic devices. In FIG. 2A, a semiconductor wafer is shown with an array of semiconductor device dies 102 in rows and columns formed on an active surface. The semiconductor device dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. A single semiconductor device die 102 is shown in FIG. 2B, with bond pads 108, which are conductive pads that are electrically coupled to devices formed in the semiconductor device die. Vertical and horizontal (as the wafer is oriented in FIG. 2A) scribe lanes 103 and 104, which are perpendicular to one another and which run in parallel groups across the wafer 101, separate the rows and columns of the completed semiconductor device dies 102, and provide an area for dicing the wafer to separate the devices from one another.

FIG. 2B shows a single semiconductor device die 102 shown in a close up view with bond pads 108 on an active surface of the semiconductor device die 102. FIG. 2C shows semiconductor device dies 102 after the dies have been singulated from the semiconductor wafer 101 with bond pads 108 facing away from a package substrate 158. In the illustrated example, the package substrate 158 is a conductive lead frame. Each unit lead frame 124 in a strip or array is spaced from an adjacent unit lead frame by a saw street 126. Leads 120 are spaced from die mount pads 112 in the unit lead frames 124.

In FIG. 2D, another cross-sectional view shows the singulated semiconductor device dies 102 mounted on the die mount pads 112 using a die attach 109 such as solder or an adhesive. Some adhesives for die mounting are referred to as "die attach" and these can be used. Die attach 109 can be thermally insulating or thermally conductive.

FIG. 2E in another cross-sectional view, bond pads 108 on the semiconductor device dies 102 are electrically connected to leads 120 with conductors 106. In the example of FIG. 2E the conductors 106 are wire bonds. Ribbon bonds or other conductive connectors can be used.

Figure 2F:
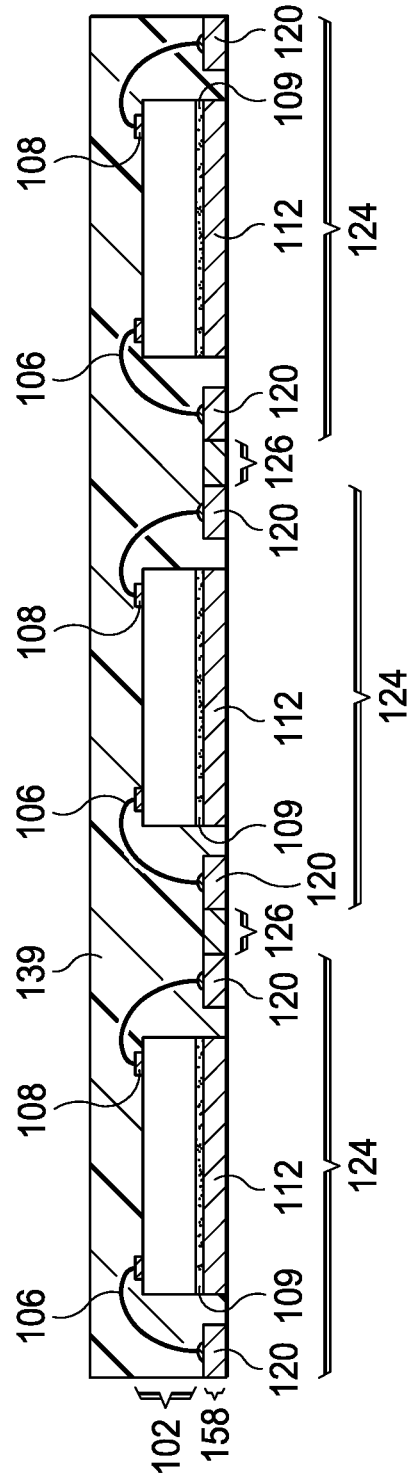

In FIG. 2F, the semiconductor device dies 102, the conductors 106, and portions of the lead frame leads 120 are shown covered with a mold compound 139 such as a filled resin epoxy. The mold compound 139 can be subjected to a thermal cure or can be a thermoset mold compound, heated to liquefy it, and dispensed in a transfer mold as a heated liquid that cures and solidifies as it cools.

Figure 2G:
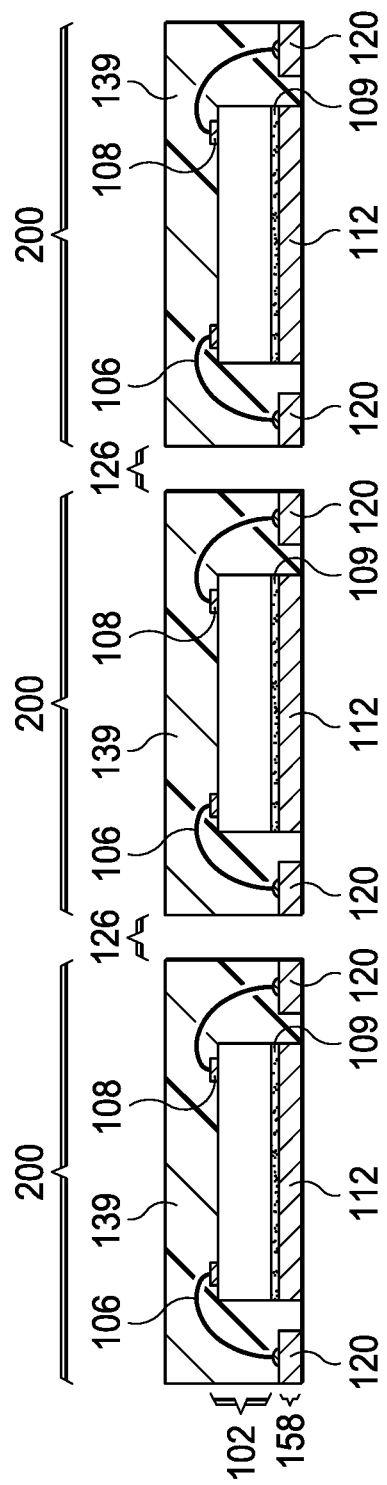

In FIG. 2G, a cross-sectional view shows individual packaged semiconductor devices 200 that are singulated one from one another by cutting through the saw streets 126 on the package substrate 158. Each packaged semiconductor device 200 has a package body of mold compound 139, leads 120 that are partially covered by the mold compound 139 and exposed from the mold compound to form terminals for the packaged semiconductor device.

Figure 3:
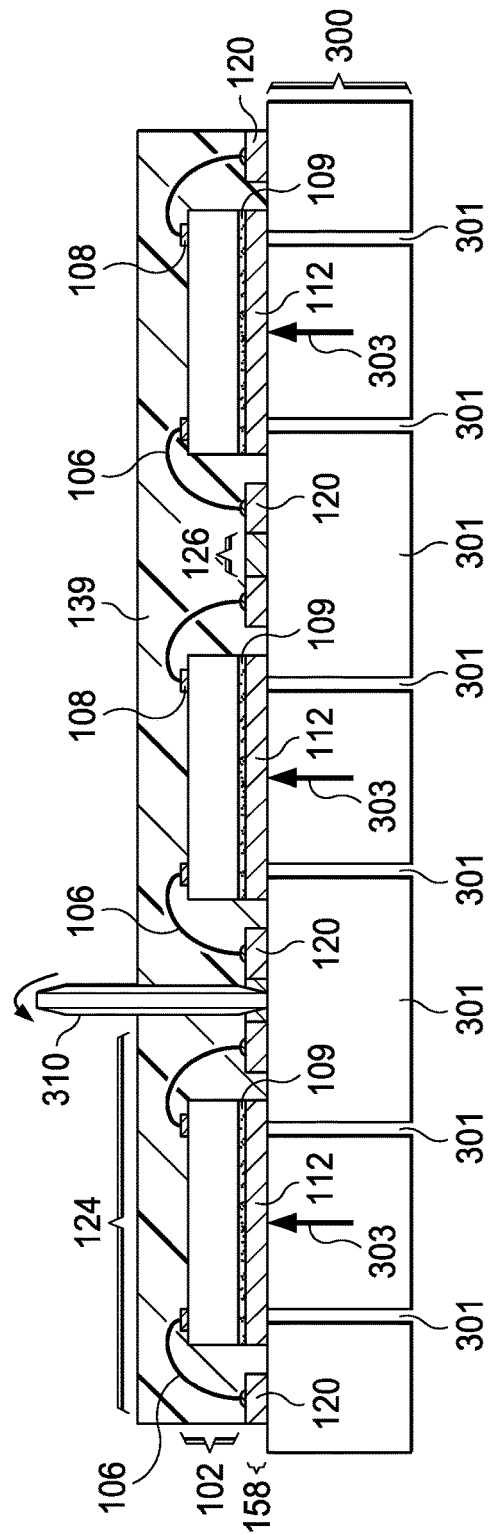
FIG. 3 illustrates in a cross-sectional view a sawing operation on molded electronic devices.

FIG. 3 illustrates in a cross-sectional view a sawing operation to separate packaged semiconductor devices. A device chuck 300 supports a strip or array of packaged semiconductor devices joined by mold compound 139 and package substrate 158, as shown in FIG. 2F above. A saw 310 traverses saw streets 126 between the devices, cutting through the mold compound 139 and package substrate 158. A vacuum chuck is used to increase the holding force of the package strip to the surface of chuck 300. Vacuum ports 301 apply vacuum force 303 to the bottom surface of the packaged semiconductor devices to increase the holding force on the devices while the saw 310 traverses the saw streets. The saw 310 illustrated in FIG. 3 is a rotating blade. In additional arrangements, the saw 310 can include an abrading coating, such as diamond. In an alternative arrangement (not shown) the saw can be by other cutting tools such as laser, plasma cutter, or liquid jet cutters to cut through the material in saw streets 126 between the 124.

Figure 4:
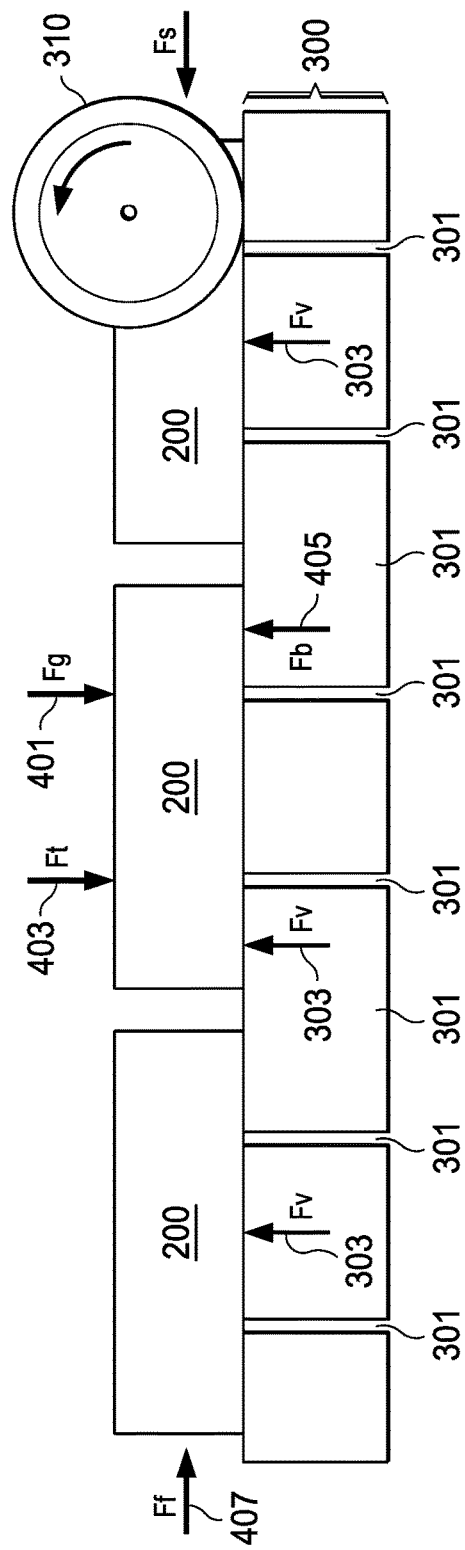
FIG. 4 illustrates in a cross-sectional view force vectors in a sawing operation.

FIG. 4 is another cross-sectional view of saw 310 traversing saw streets to cut apart packaged semiconductor devices 200, illustrating forces on the devices using force arrows. The vacuum chuck 300 supports the packaged devices 200 and vacuum ports 301 apply vacuum resulting in force Fv (shown as arrows Fv 303). Saw 310 traverses the array of semiconductor devices 200 and exerts a lateral force Fs. Atmospheric or pneumatic forces Ft (arrow 403) and Fb (arrow 405) exert vertical forces on the devices, the vacuum ports exert a vacuum that minimizes the force Fb on the bottom side of the devices. Gravity force Fg, (arrow 401) and pneumatic force Ft then add to make a force normal to the direction of the saw, Fn.

Using FIG. 4 as a force diagram, then:

$Fn$(force normal to saw force)$=Ft-Fb$      Equation 1

$Fb \cong 0$, due to vacuum force Fv $Fn = Ft$      Equation 2

$Ff$(friction force opposing saw force $Fs$)$=\mu Fn = \mu Ft$      Equation 3

Where $\mu$ is a weighting factor, Ff is a portion of the force Ft

Since the devices are not to be displaced in normal sawing operation, $Ff \gtrsim F$saw      Equation 4

$Ft = P$atmos$*$Area(device area)      Equation 5 that is, Ft is equal to the atmospheric pressure applied to device area.

Therefore, $Ft \propto$ Area      Equation 6

Equation 4 shows that the friction force Ff is sufficient to hold the devices 200 against the chuck while the saw (lateral force Fsaw) moves along the saw streets. However, as the device sizes are continually falling, the device area ("Area" in Equation 5) is also falling. Ft is therefore falling (see Equation 6). When the device area falls to a point where the force Ft is equal to or less than Fsaw, which is fixed, the force Ff may not be sufficient to hold the devices on the chuck 300. This problem is already seen in known molded package sawing operations when devices sometimes fly off the chuck during sawing. As device area continues to decrease, fly off problems increase.

Figure 5:
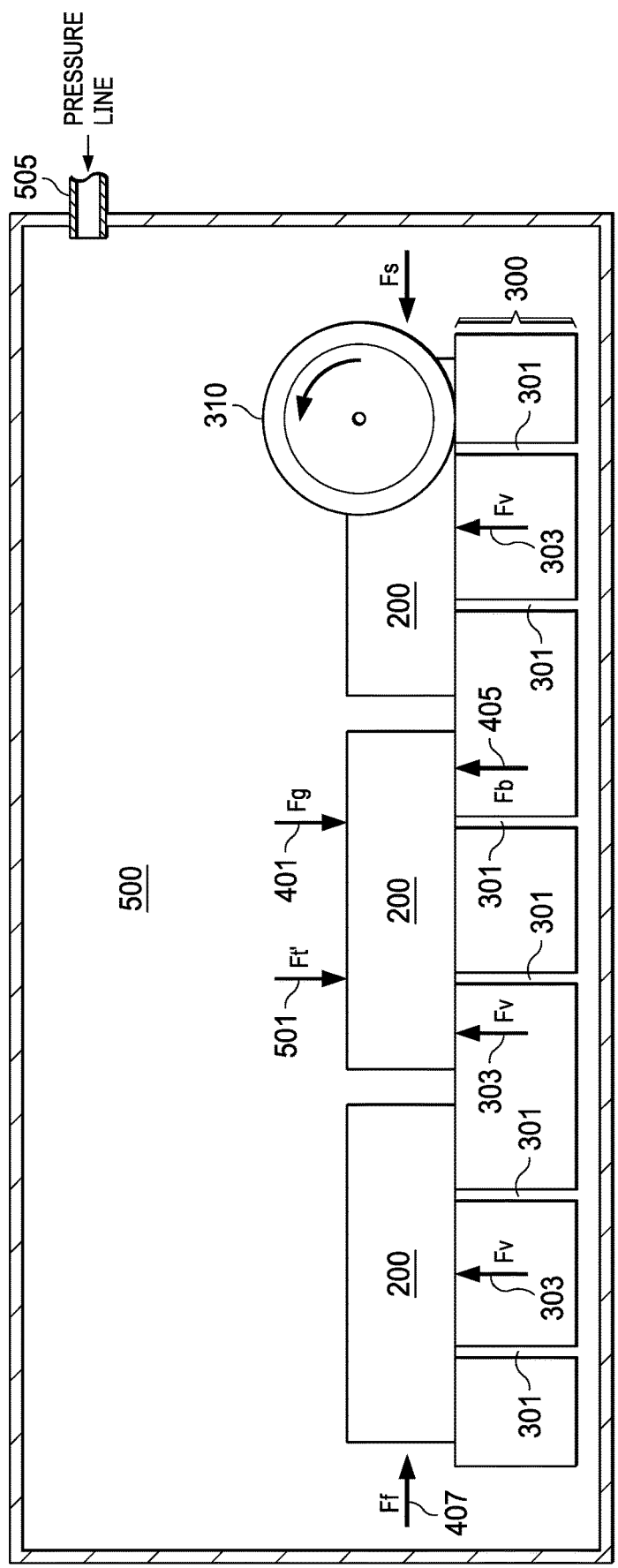
FIG. 5 illustrates the operation of an arrangement and the force vectors for a sawing operation of the arrangement.
Figure 6:
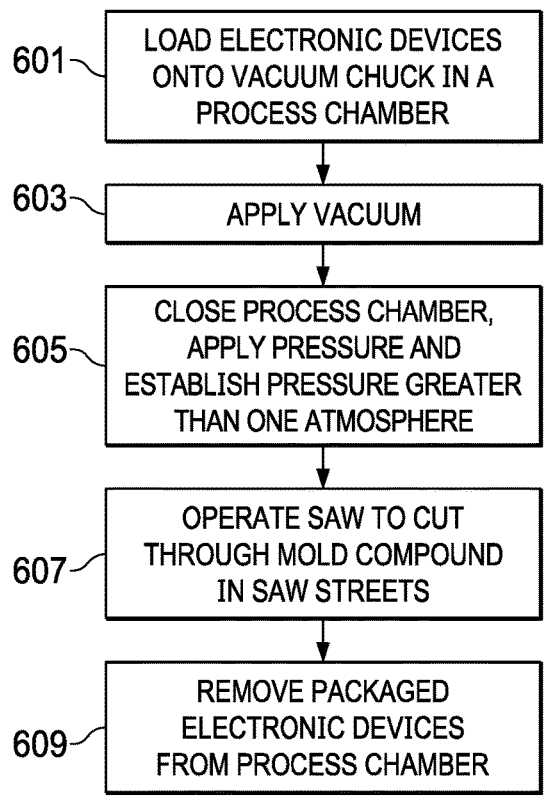
FIG. 6 is a flow diagram illustrating a method for an arrangement having a process chamber.

FIG. 5 illustrates in a cross section an arrangement for a saw. FIG. 6 illustrates, in a flow diagram, a method for operating the arrangement. In FIG. 5, a process chamber 500 that is capable of maintaining pressure above atmospheric pressure is coupled to a pressure supply line 505. Vacuum chuck 300 is within the chamber along with saw 310. Molded electronic devices 200 are shown being sawn by saw 310.

Referring to FIG. 6, in operation the molded electronic devices 200, in a strip or array of devices spaced by saw streets 126, is placed onto the vacuum chuck 300 in the process chamber (see step 601). At step 603, a vacuum is applied to the vacuum chuck by vacuum ports 301. At step 605, the chamber 500 is closed and pressure from the pressure supply line 505 increases the pressure in the chamber. At step 607, the saw 310, which in this example is a saw with a rotating blade, traverses the saw streets, cutting through the package substrate and mold compound in the saw streets to separate the molded electronic devices 200 from one another, or singulate them, forming packaged electronic devices. At step 609, the sawing is complete, the pressure in the chamber 500 is then released, and the chamber 500 can be opened to remove the devices for further processing.

The increased pressure effects the vertical force Ft':

$$Ft'=P\text{chamber}*\text{Area},\qquad\text{Equation 7}$$

As the pressure in the chamber increases, the force Ft' increases. In the arrangements, the friction force Ff, which is proportional to Ft', also increases. Because the friction force Ff needs to be equal to or exceed the lateral saw force Fsaw to prevent fly off events, use of the arrangements enables the force Ff to be increased even as the device sizes, and device area, decreases. The arrangements thus reduce or eliminate fly off problems in sawing operations.

Figure 8:
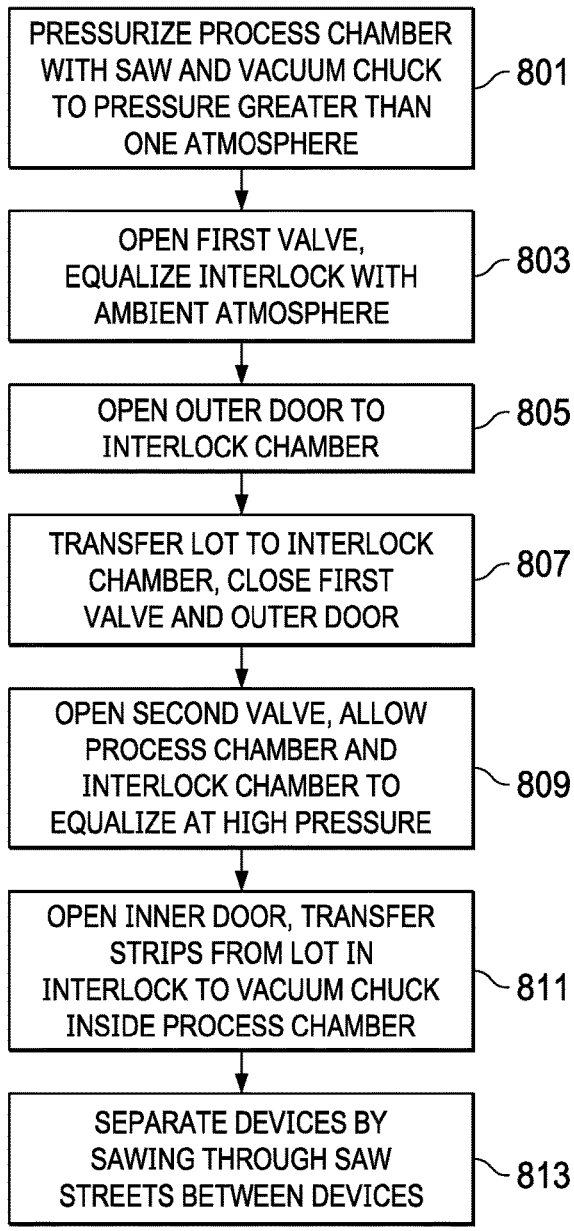
FIG. 8 illustrates in a flow diagram a method for the arrangement of FIGS. 7A-7F.

FIGS. 7A-7F illustrate, in a series of cross-sectional views, a further arrangement for a process chamber for performing sawing operations at hyperbaric pressure. FIG. 8 illustrates in a flow diagram a method for the arrangement.

Figure 7A:
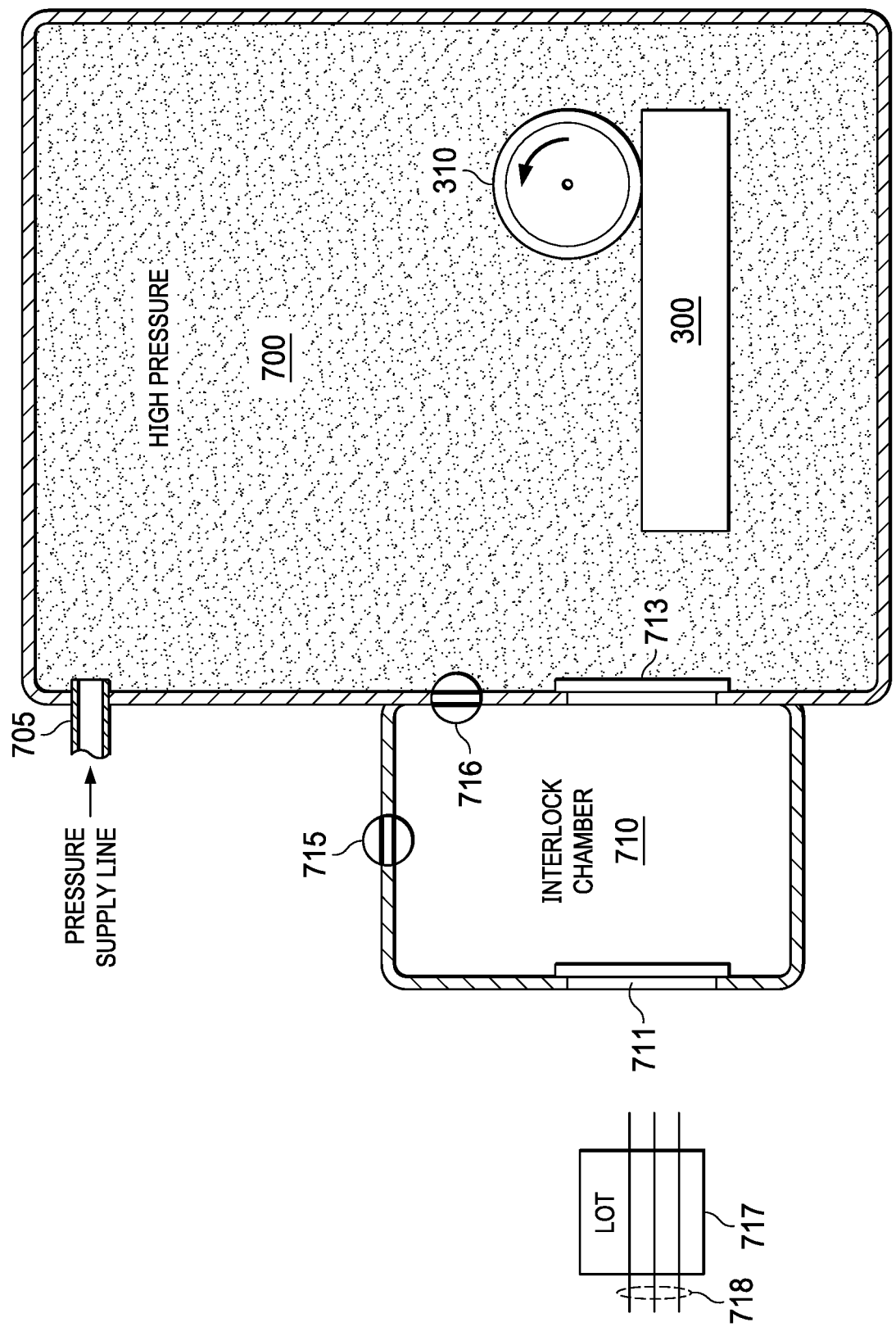
FIGS. 7A-7F illustrate, in a series of cross sections, the operation of an arrangement having a process chamber with an interlock chamber.

In FIG. 7A, a process chamber 700 is shown. A pressure supply line 705 provides pressurized air to the process chamber 700. A saw 310 and a vacuum chuck 300 are in the process chamber 700. In the example of FIGS. 7A-7F, the saw 310 is a rotating blade saw. The blade can include an abrading surface, such as diamond. In alternative arrangements, the cutting could be by laser, plasma cutter, liquid jet cutter or another cutting methods. One or more interlock chambers can be used to transfer material in lots between an external ambient pressure and the high pressure in process chamber 700 without depressurizing the process chamber. An interlock chamber 710 has an outer door 711 between ambient atmospheric pressure and the interlock chamber 710, and an inner door 713 between the interlock chamber 710 and the high pressure in process chamber 700. A first valve 715 allows interlock chamber 710 to transition to and equalize with ambient atmosphere pressure outside the process chamber 700, and a second valve 716 allows interlock chamber 710 to transition to and equalize with the high pressure in process chamber 700. A material lot (labeled "LOT" in the figures) 717 with strips 718 of molded semiconductor devices is shown outside the process chamber in FIG. 7A. The material lot 717 can include one strip of devices, one array of devices in rows and columns, or many strips or many arrays in a holder, container, carrier or rack that carries the lot. Many hundreds or thousands of packaged devices may be in a single material lot. Note that while as illustrated, a single interlock chamber 710 is shown, in alternative arrangements, a second interlock chamber can be added to provide separate input and output paths to the process chamber 700, to increase throughput.

Referring to FIG. 8, a method for the arrangement begins at step 801, when the pressure above one atmosphere is established in the process chamber 700. Because the arrangement shown in FIGS. 7A-7F has an interlock and material lot transfer capability, the pressure in the process chamber 700 can be maintained across the operations for many material lots.

Figure 7B:
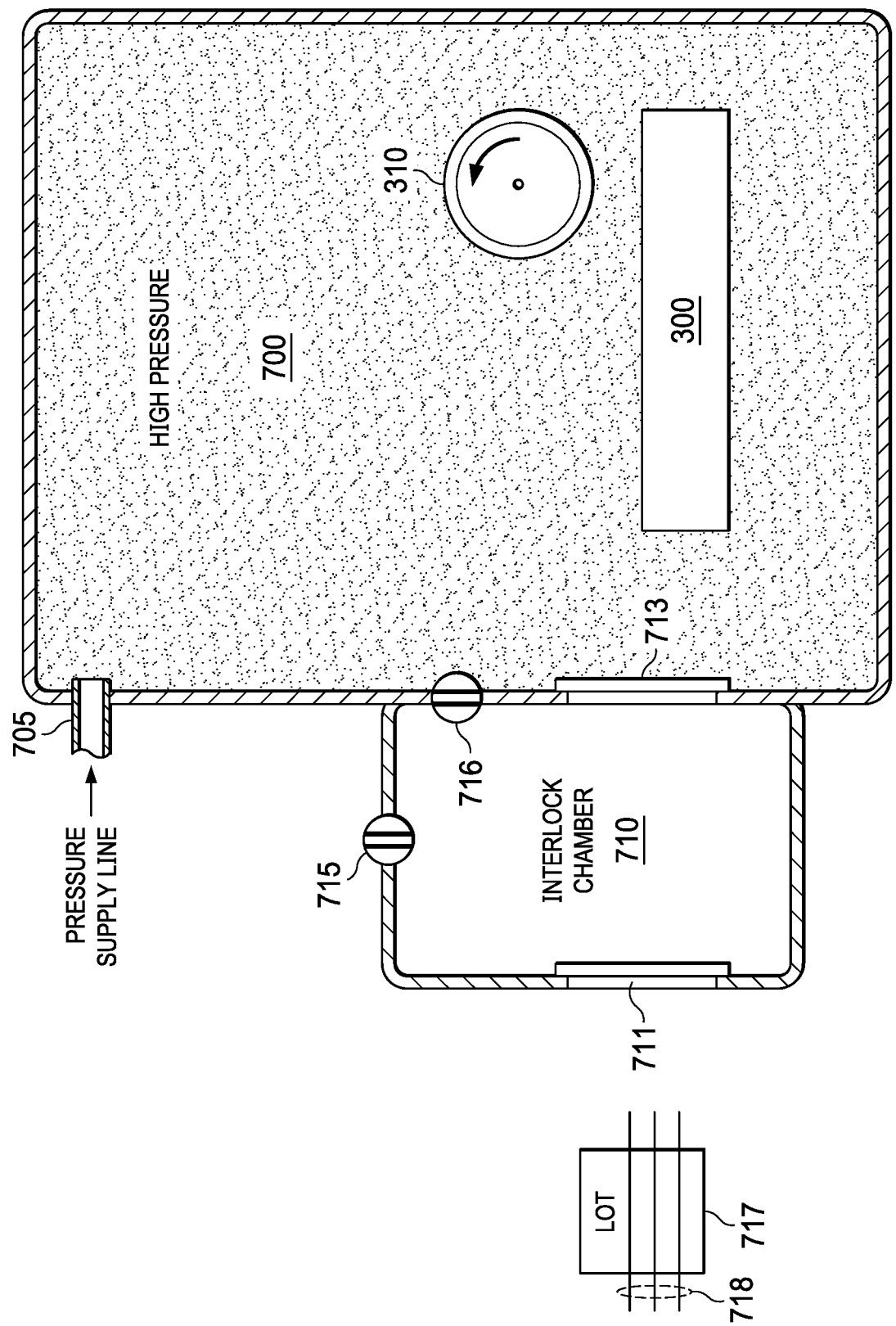

At step 803, the first valve 715 is opened to equalize pressure between the interlock chamber 710 and the ambient atmosphere outside the process chamber, as shown in FIG. 7B, when valve 715 is opened as indicated by the position of the valve, air at ambient pressure can be exchanged with the interlock chamber 710. The inner door 713 and the second valve 716 remain closed, so high pressure within the process chamber 700 is maintained.

Figure 7C:
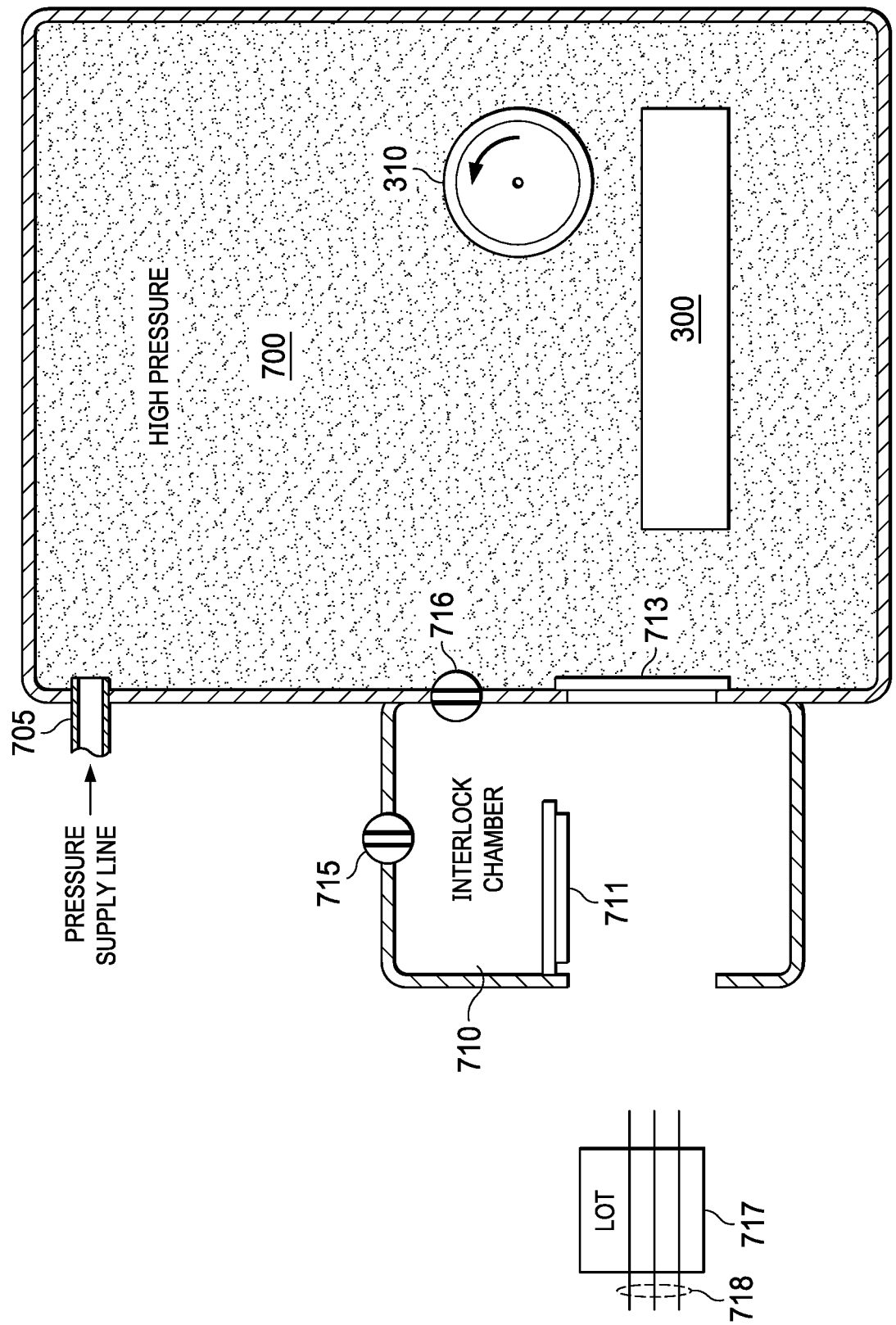

At step 805, as shown in FIG. 7C, the outer door is opened and the interlock chamber 710 is ready to receive the material in LOT 717, the interlock chamber is at ambient pressure, while the process chamber 700 remains at high pressure.

Figure 7D:
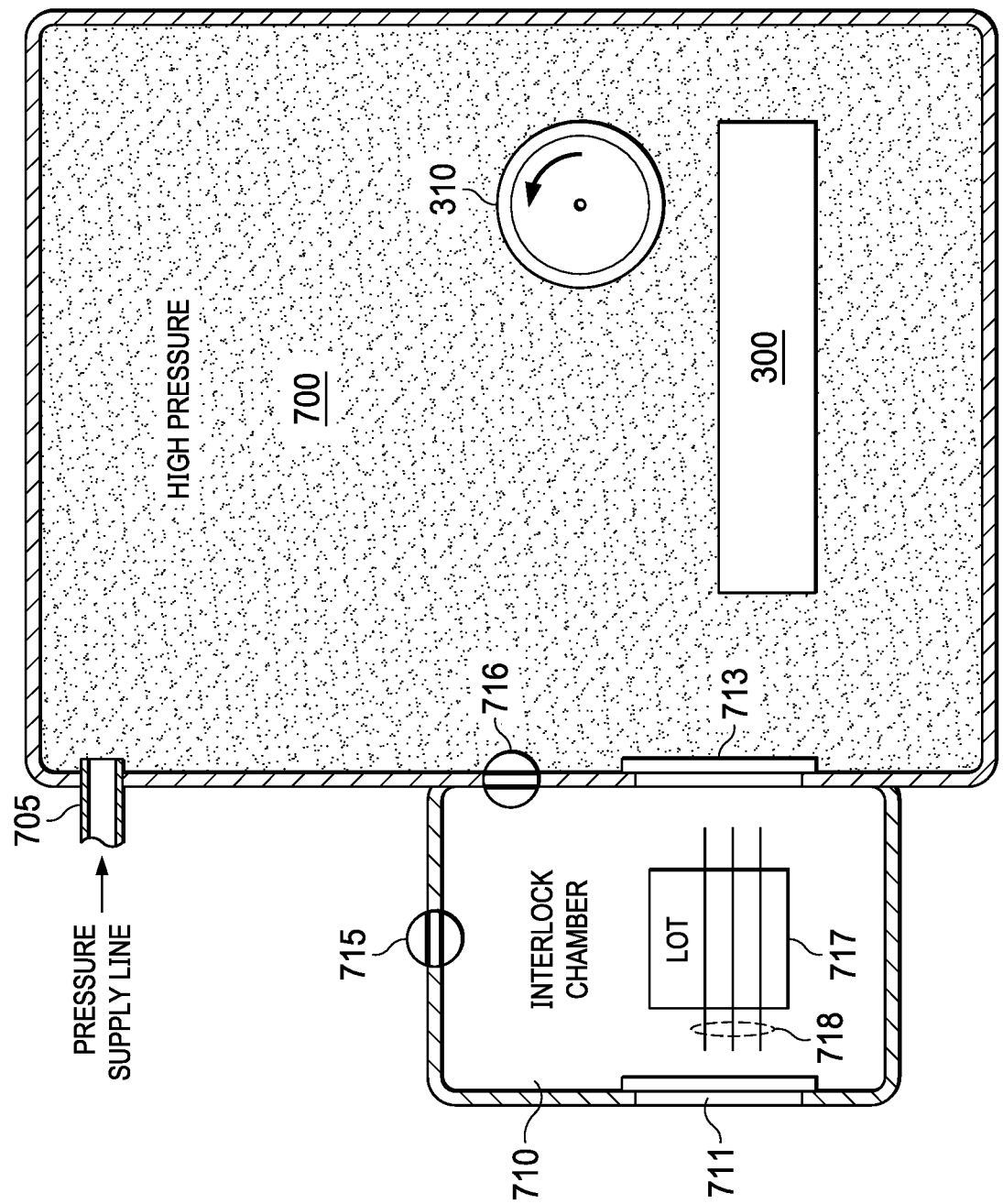

At step 807, as shown in FIG. 7D, LOT 717 is transferred into the interlock chamber 710, the outer door 711 is closed so seal the interlock chamber, and the first valve 715 is closed. At step 809, as shown in FIG. 7E, the valve 716 is opened to allow high pressure to enter interlock chamber 710 allowing the pressure equalization between the process chamber 700 and interlock chamber 710.

Figure 7E:
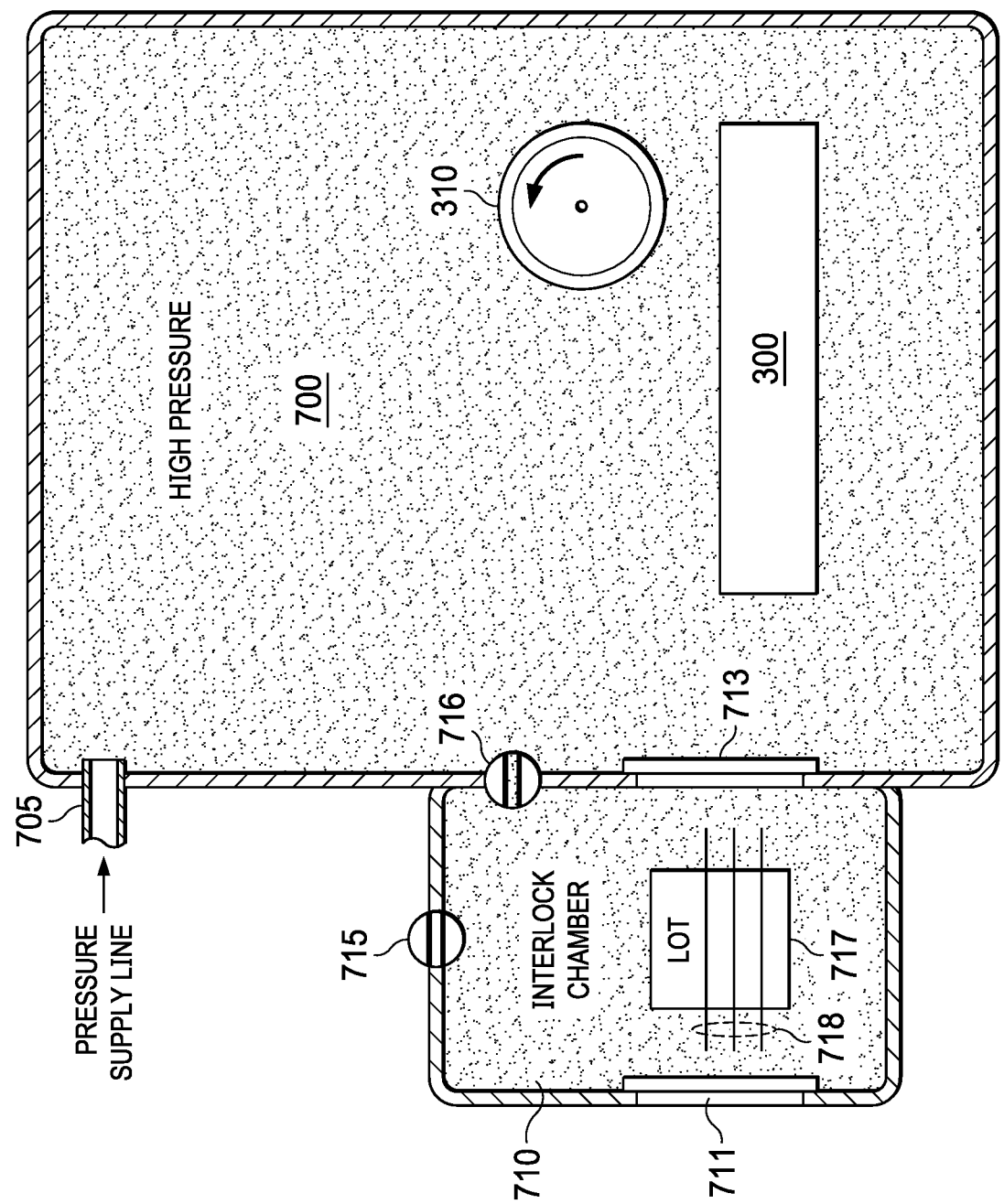
Figure 7F:
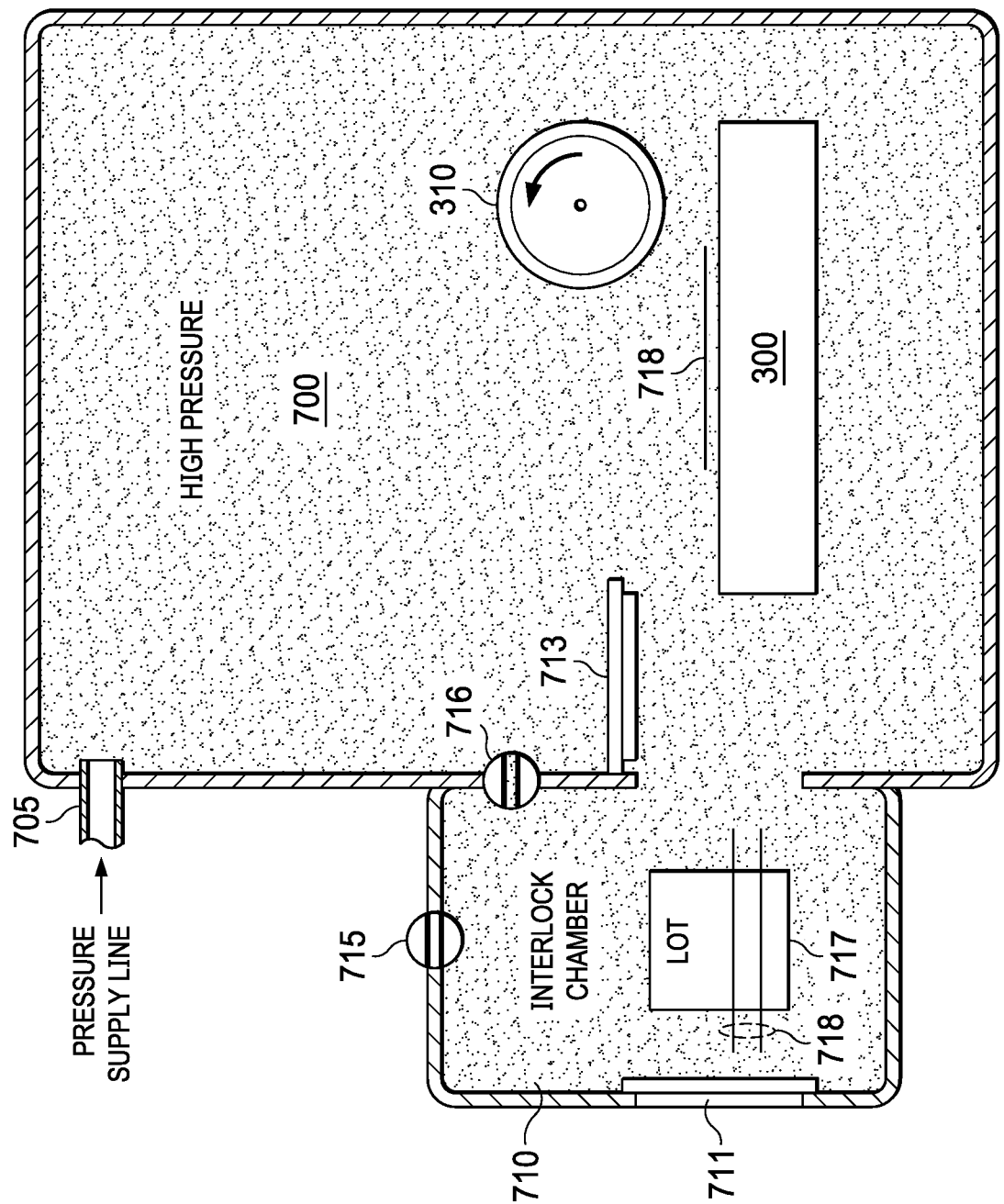

At step 811, as shown in FIG. 7E, the inner door 713 is opened, the second valve 716 remains open, and strips from LOT 717 are transferred from the interlock chamber 710 into the process chamber 700 and onto the vacuum chuck 300 for sawing. At step 813, as shown in FIG. 7F, the process chamber 700 is at high pressure, a strip 718 is on the chuck 300 and ready for the saw 310 to begin traversing the saw streets and separate the packaged electronic device as described above. After the sawing, the interlock chamber 710 can be used to remove the separated packaged electronic devices from the process chamber 700 by opening the second valve 716 to equalize pressure between the process chamber 700 and the interlock chamber 710. Then, by opening the inner door 713, the separated devices can be transferred to the interlock chamber 710. By closing the inner door 713 and the second valve 716, the valve 715 can be opened to equalize the pressure in the interlock chamber 710 with the ambient atmospheric pressure. Then, by opening the outer door 711, the separated packaged devices can be removed from the interlock chamber 710. In an additional arrangement, an additional interlock chamber could be added to the process chamber 700 so that devices being removed after sawing can exit the process chamber through a different interlock chamber than the one used to load incoming lots, increasing throughput. In these arrangements, the process chamber 700 remains at high pressure, so that no time is spent re-pressurizing the process chamber 700 between lots.

As shown by Equation 6 and Equation 7 described above, the amount of pressure needed to prevent fly off events depends on the area of the packaged electronic devices. Pressures greater than 1 atmosphere are used. An example arrangement uses 2 atmospheres of pressure in the process chamber. The pressure can be increased above atmospheric pressure to the pressure needed to prevent device fly off for a particular device package. As package area falls, the pressure needed to prevent fly-off will increase, as described above. Pressures above one atmosphere, and up to seven atmospheres, or more, are useful. Packaged device sizes can range from about 3 millimeters by 3 millimeters, to less than 1 millimeter×1 millimeter. As pressures increase still further, some additional safety procedures may be needed or desired, or added costs may be incurred, to design the process chamber and interlock chambers for safely maintaining the higher pressures.

Modifications are possible in the described arrangements, and other alternative arrangements are possible within the scope of the claims.

What is claimed is:

1. A method for packaging electronic devices, comprising:
   forming electronic devices on a semiconductor wafer;
   separating the electronic devices from one another by cutting through the semiconductor wafer in scribe lanes on the semiconductor wafer between the electronic devices;
   mounting the electronic devices on a package substrate, the package substrate carrying an array of electronic devices, the electronic devices spaced from one another on the package substrate by saw streets defined between the electronic devices;
   electrically coupling bond pads on the electronic devices to leads on the package substrate;
   covering the electronic devices and portions of the package substrate with mold compound;
   placing the array of electronic devices on a device chuck in a process chamber;
   increasing a pressure in the process chamber to a pressure greater than one atmosphere;
   sawing through the mold compound and the package substrate along the saw streets between the electronic devices to separate molded electronic devices one from another; and
   removing the molded electronic devices from the process chamber.

2. The method of claim 1, wherein increasing the pressure comprises increasing the pressure in the process chamber to a pressure between greater than one atmosphere and seven atmospheres.

3. The method of claim 1, wherein sawing further comprises sawing along first parallel saw streets in a first direction, and sawing along second parallel saw streets in a second direction, the second direction perpendicular to the first.

4. The method of claim 1, wherein sawing comprises sawing between electronic devices in a strip that is one device wide, the sawing in a direction perpendicular to the direction along outer edges of the one device wide strip.

5. The method of claim 1, wherein sawing comprises sawing using a rotating mechanical blade.

6. The method of claim 1, wherein sawing comprises sawing using one selected from a laser, plasma cutter, and liquid jet cutter to cut through mold compound and package substrates in the saw streets.

* * * * *